US012243971B2

(12) United States Patent
Pyo et al.

(10) Patent No.: US 12,243,971 B2
(45) Date of Patent: Mar. 4, 2025

(54) DISPLAY DEVICE

(71) Applicant: Samsung Display Co., LTD., Yongin-si (KR)

(72) Inventors: Ki Hyun Pyo, Yongin-si (KR); Jin Seon Kwak, Yongin-si (KR); Kyung Bae Kim, Yongin-si (KR); Yeon Kyung Kim, Yongin-si (KR); Ji Hye Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 437 days.

(21) Appl. No.: 17/683,889

(22) Filed: Mar. 1, 2022

(65) Prior Publication Data

US 2023/0006115 A1 Jan. 5, 2023

(30) Foreign Application Priority Data

Jul. 1, 2021 (KR) .................... 10-2021-0086689

(51) Int. Cl.
*H01L 33/62* (2010.01)
*H01L 33/38* (2010.01)

(52) U.S. Cl.
CPC ............ *H01L 33/62* (2013.01); *H01L 33/382* (2013.01)

(58) Field of Classification Search
CPC .................................................. H01L 25/0753
See application file for complete search history.

(56) References Cited

U.S. PATENT DOCUMENTS

| | | | |
|---|---|---|---|
| 6,255,130 B1 | 7/2001 | Kim | |
| 2017/0338372 A1* | 11/2017 | Teraguchi | ............... H01L 33/06 |
| 2021/0242380 A1 | 8/2021 | Kim et al. | |
| 2021/0343761 A1 | 11/2021 | Kim et al. | |
| 2022/0181522 A1 | 6/2022 | Moon et al. | |

FOREIGN PATENT DOCUMENTS

| | | |
|---|---|---|
| KR | 10-0372306 B1 | 8/2003 |
| KR | 10-2017-0022755 A | 3/2017 |
| KR | 10-2019-0095638 A | 8/2019 |
| KR | 10-2019-0124359 A | 11/2019 |
| KR | 10-2020-0102607 A | 9/2020 |
| KR | 10-2020-0121956 A | 10/2020 |
| KR | 10-2020-0145965 A | 12/2020 |
| KR | 10-2021-0044354 A | 4/2021 |

* cited by examiner

*Primary Examiner* — Matthew L Reames
(74) *Attorney, Agent, or Firm* — Womble Bond Dickinson (US) LLP

(57) ABSTRACT

A display device according to some embodiments includes a substrate, a first power line extending in a first direction on the substrate, and configured to transmit a first alignment signal or a first driving voltage, a second power line extending in the first direction on the substrate, and configured to transmit a second alignment signal or a second driving voltage, a first electrode extending in a second direction that is substantially perpendicular to the first direction, configured to receive the first alignment signal or the first driving voltage, and electrically connected to the first power line, a second electrode spaced apart from the first electrode, extending in the second direction, configured to receive the second alignment signal or the second driving voltage, and electrically connected to the second power line, and a light emitting element between the first electrode and the second electrode.

17 Claims, 13 Drawing Sheets

DISPLAY DEVICE

CROSS-REFERENCE TO RELATED APPLICATION

This application claims priority to, and the benefit of, Korean Patent Application No. 10-2021-0086689 filed on Jul. 1, 2021, the content of which in its entirety is herein incorporated by reference.

BACKGROUND

1. Field

The disclosure relates to a display device.

2. Description of the Related Art

As interest in an information display is increasing and a demand for using a portable information media is increasing, a demand and commercialization for a display device are being focused.

SUMMARY

An object of the disclosure is to provide a display device capable of widely and efficiently disposing a driving voltage supply line in a non-display area.

A display device according to an embodiment of the disclosure includes a substrate, a first power line extending in a first direction on the substrate, and configured to transmit a first alignment signal or a first driving voltage, a second power line extending in the first direction on the substrate, and configured to transmit a second alignment signal or a second driving voltage, a first electrode extending in a second direction perpendicular to the first direction, to which the first alignment signal or the first driving voltage is applied, a second electrode spaced apart from the first electrode and, extending in the second direction, to which the second alignment signal or the second driving voltage is applied, and a light emitting element between the first electrode and the second electrode. The first electrode is electrically connected to the first power line, and the second electrode is electrically connected to the second power line.

A first end part of the light emitting element may be configured to be aligned toward the first electrode by the first alignment signal, wherein a second end part of the light emitting element is configured to be aligned toward the second electrode by the second alignment signal.

The display device may further include a protective layer between the first power line and the first electrode, which are on different layers, wherein the first power line and the second power line are on a same layer, and wherein the first electrode and the second electrode are on a same layer.

The first electrode may be electrically connected to the first power line through a first contact hole of the protective layer.

The second electrode may be electrically connected to the second power line through a second contact hole of the protective layer.

The display device may further include a data conductive layer on the same layer as the first power line, wherein the data conductive layer includes a first data conductor and a second data conductor configured to transmit the first driving voltage.

The first data conductor and the second data conductor may be electrically connected to the first electrode through respective contact holes of the protective layer.

The first electrode may define a first opening, a second opening, and a third opening.

A remaining part of the first electrode may be between the first opening and the second opening, and may be electrically connected to the data conductive layer.

A first end part of the light emitting element may be electrically connected to the first electrode, wherein a second end part of the light emitting element is electrically connected to the second electrode.

A display device according to some embodiments of the disclosure includes a substrate on which a first pixel row and a second pixel row including pixels are located, a first power line extending in a first direction between the first pixel row and the second pixel row, and configured to supply a first alignment signal or a first driving voltage, a second power line extending from one side of the first pixel row in the first direction, and configured to supply a second alignment signal or a second driving voltage, a first electrode extending in a second direction perpendicular to the first direction, to which the first alignment signal or the first driving voltage is applied, and a second electrode spaced apart from the first electrode and, extending in the second direction, to which the second alignment signal or the second driving voltage is applied. The first electrode is electrically connected to the first power line, and the second electrode is electrically connected to the second power line.

The display device may further include a protective layer between the first power line and the first electrode, which are on different layers, wherein the first power line and the second power line are on a same layer, and wherein the first electrode and the second electrode are on a same layer.

The first electrode may be electrically connected to the first power line through a first contact hole of the protective layer, wherein the second electrode is electrically connected to the second power line through a second contact hole of the protective layer.

The display device may further include a first data conductor, a second data conductor, and a third data conductor on the same layer as the first power line, and each configured to transmit the first driving voltage, wherein the first pixel row includes a first pixel, a second pixel, and a third pixel extending in the first direction.

The first data conductor may be electrically connected to the first electrode through a first contact hole of the first pixel, wherein the second data conductor is electrically connected to the first electrode through a first contact hole of the second pixel, and wherein the third data conductor is electrically connected to the first electrode through a first contact hole of the third pixel.

The display device may further include a light emitting element between the first electrode and the second electrode, wherein a first end part of the light emitting element is configured to be aligned toward the first electrode by the first alignment signal, and a second end part of the light emitting element is configured to be aligned toward the second electrode by the second alignment signal.

A display device according to some embodiments of the disclosure includes a substrate including a substrate including a display area for displaying an image, and a non-display area on at least one side of the display area, a first line in the non-display area, and configured to supply a first alignment signal or a first driving voltage, a second line in the non-display area, and configured to supply a second alignment signal or a second driving voltage, a first electrode in the display area, and electrically connected to the first line, and a second electrode in the display area, and electrically connected to the second line.

The display device may further include a first power line extending in a first direction on the substrate, and configured to transmit the first alignment signal or the first driving voltage, wherein the first electrode is electrically connected to the first line through the first power line.

The display device may further include a second power line extending in the first direction on the substrate, and configured to transmit the second alignment signal or the second driving voltage, wherein the second electrode is electrically connected to the second line through the second power line.

The display device may further include a light emitting element between the first electrode and the second electrode, wherein a first end part of the light emitting element is configured to be aligned toward the first electrode by the first alignment signal, and wherein a second end part of the light emitting element is configured to be aligned toward the second electrode by the second alignment signal.

Because the display device according to some embodiments may apply an alignment signal or a driving voltage to pixels through a first line and a second line, the first line and the second line may be widely located in the non-display area.

In addition, the display device according to some embodiments may reduce or minimize a number of lines suitable for driving the pixel in the non-display area, thereby reducing a load of the line.

An aspect according to some embodiments of the disclosure is not limited to the contents illustrated above, and other various aspects are included in the present specification.

BRIEF DESCRIPTION OF THE DRAWINGS

The above and other aspects of the disclosure will become more apparent by describing in further detail embodiments of the present disclosure with reference to the accompanying drawings, in which.

DETAILED DESCRIPTION

Figure 1:
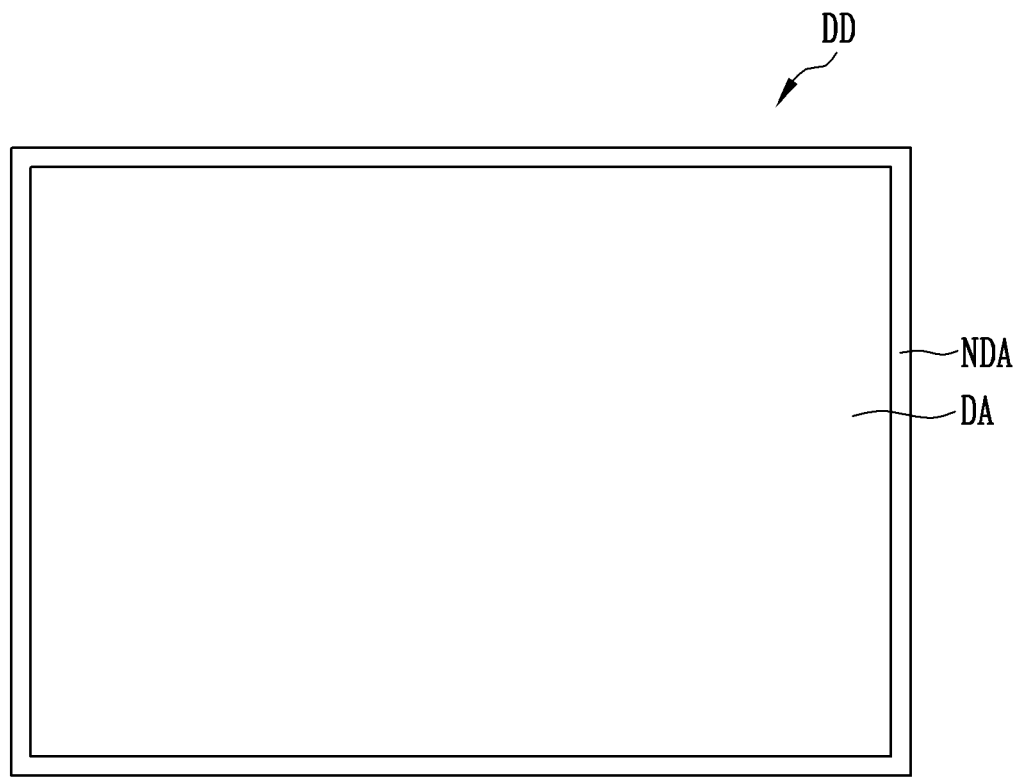
FIG. 1 is a schematic plan view of a display device according to some embodiments.
Figure 1:
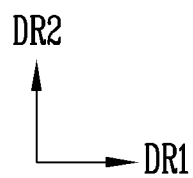

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
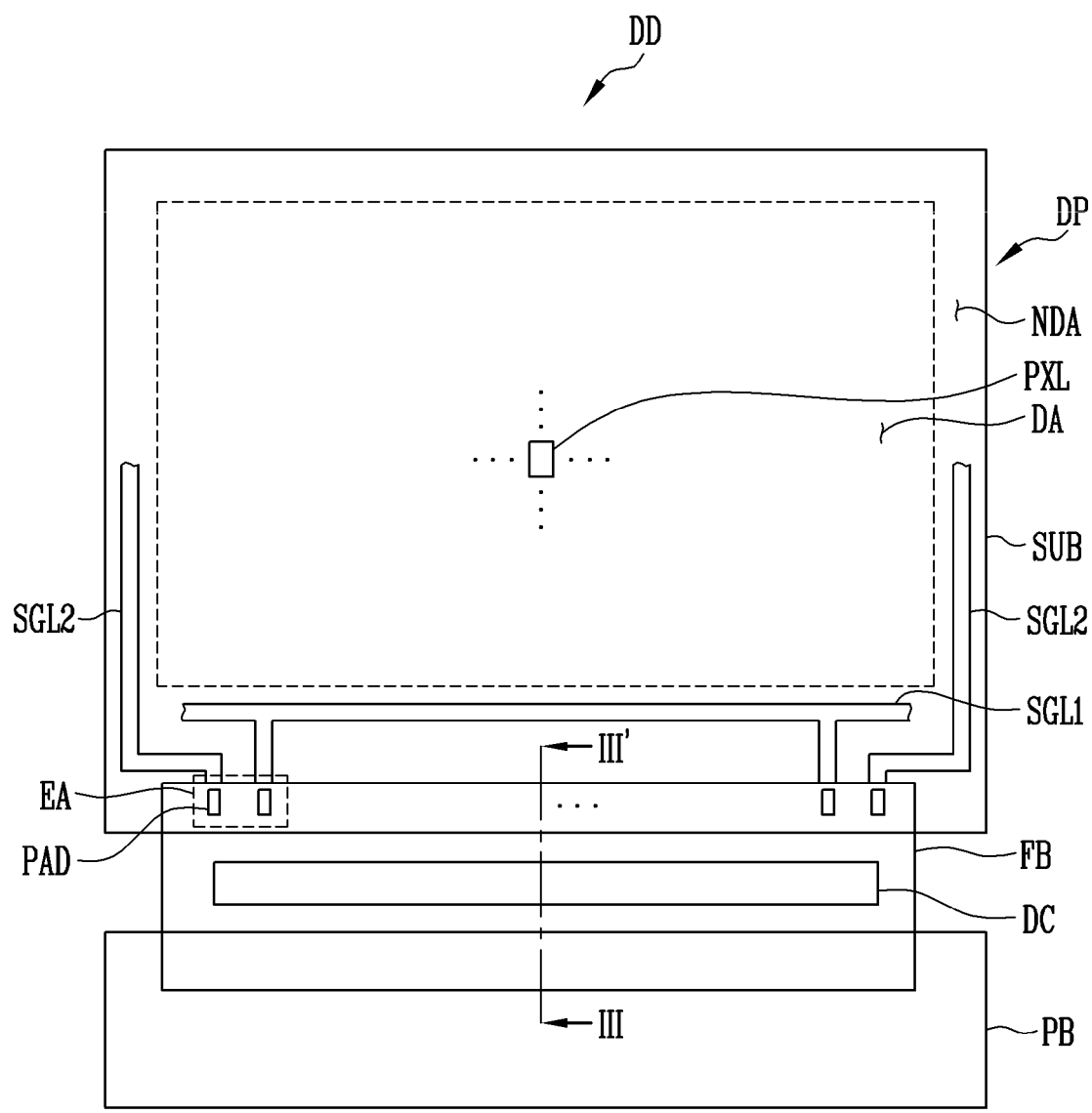
FIG. 2 is a schematic arrangement view of a display device according to some embodiments.
Figure 2:
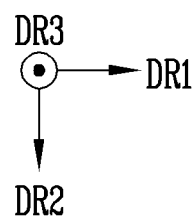
Figure 3:
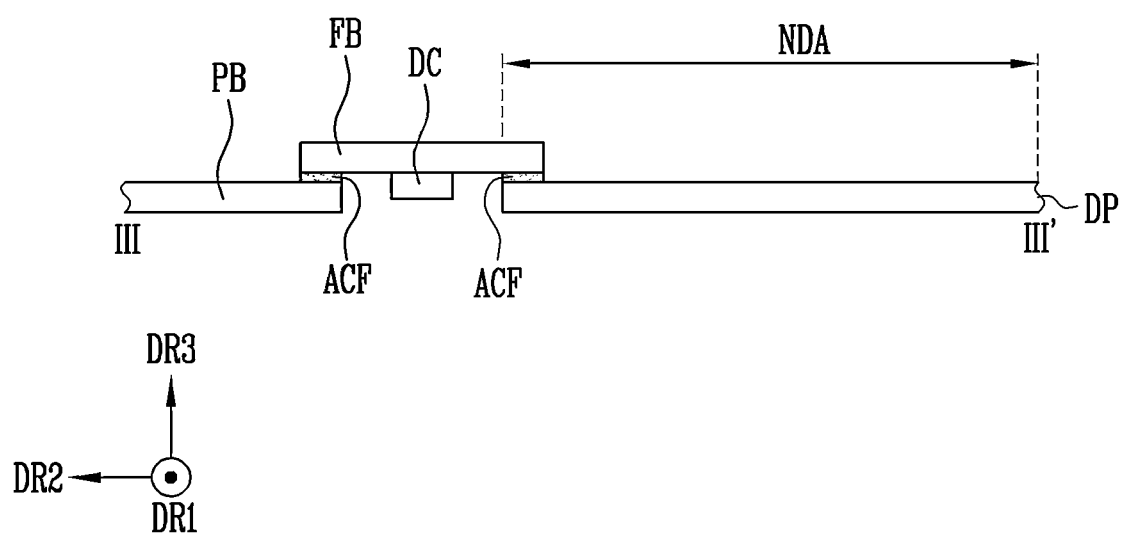
FIG. 3 is a cross-sectional view taken along the line III-III' of FIG. 2.

FIG. 1 is a schematic plan view of a display device according to some embodiments, FIG. 2 is a schematic arrangement view of a display device according to some embodiments, and FIG. 3 is a cross-sectional view taken along the line III-III' of FIG. 2.

Referring to FIG. 1, the display device DD according to some embodiments may include a display area DA for displaying an image, and a non-display area NDA that does not display an image.

The display device DD may be provided in a plate shape of a rectangle. The disclosure is not limited thereto, and the display device DD may be provided in a plate shape of a square, a circle, or the like, and may be provided in a quadrangle shape of which a corner part has a round shape.

The display device DD according to some embodiments may be applied to an electronic device in which a display surface is applied to at least one surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or a wearable.

Referring to FIGS. 2 and 3, the display device DD according to some embodiments may include a display panel DP, a circuit board FB, and a printed circuit board PB.

The display panel DP may include a substrate SUB, and pixels PXL provided on the substrate SUB. According to one or more embodiments, a touch sensor may be provided on the display panel DP.

The substrate SUB may include a transparent insulating material and thus may transmit light. The substrate SUB may be a rigid substrate or a flexible substrate.

The substrate SUB may include a display area DA and a non-display area NDA.

The display area DA may be an area in which an image is displayed, and may be an area in which the pixels PXL are provided. Although only one pixel PXL is shown in FIG. 2, a plurality of pixels PXL may be provided in the display area DA. In one or more embodiments, the pixels PXL may be arranged in the display area DA in a stripe arrangement structure or a PENTILE™ arrangement structure, but the disclosure is not limited thereto.

The non-display area NDA may be an area in which an image is not displayed and may be provided on at least one side of the display area DA. The non-display area NDA may surround a periphery of the display area DA.

Lines electrically connected to the pixels PXL, and a plurality of pads PAD connected to the lines, may be positioned in the non-display area NDA. The lines may electrically connect the circuit board FB and the pixels PXL. The lines may include a scan line, a data line, an emission control line, a sensing line, driving voltage supply lines, a fan-out line, and the like connected to each pixel PXL.

The driving voltage supply lines may include a first line SGL1 and a second line SGL2. The same driving voltage may be applied to the first line SGL1 and the second line SGL2, or different driving voltages may be applied to the first line SGL1 and the second line SGL2. For example, a first driving voltage may be applied to the first line SGL1, and a second driving voltage may be applied to the second line SGL2.

In addition, the driving voltage supply lines may be used as alignment signal supply lines for supplying an alignment signal (or an alignment voltage) to the corresponding pixel PXL when the light emitting elements are aligned in respective pixels PXL. At this time, alignment signals of which sizes are the same, and of which phases are opposite, may be supplied to the first line SGL1 and the second line SGL2.

The plurality of pads PAD may transmit signals (for example, the alignment signals) or driving voltages received from the circuit board FB to the first line SGL1 and the second line SGL2.

The circuit board FB may be electrically connected to one end of the display panel DP and to one end of the printed circuit board PB. The circuit board FB may be connected to each of the display panel DP and the printed circuit board PB by a corresponding conductive adhesive member (for example, an anisotropic conductive film ACF). According to one or more embodiments, the circuit board FB may be provided as a flexible printed circuit board (FPCB).

A driver DC may be located on the circuit board FB. The signals or the driving voltage may be supplied to the plurality of pads PAD of the display panel DP through the driver DC mounted on the circuit board FB.

Hereinafter, a pixel included in a display device according to some embodiments is described with reference to FIG. 4.

Figure 4:
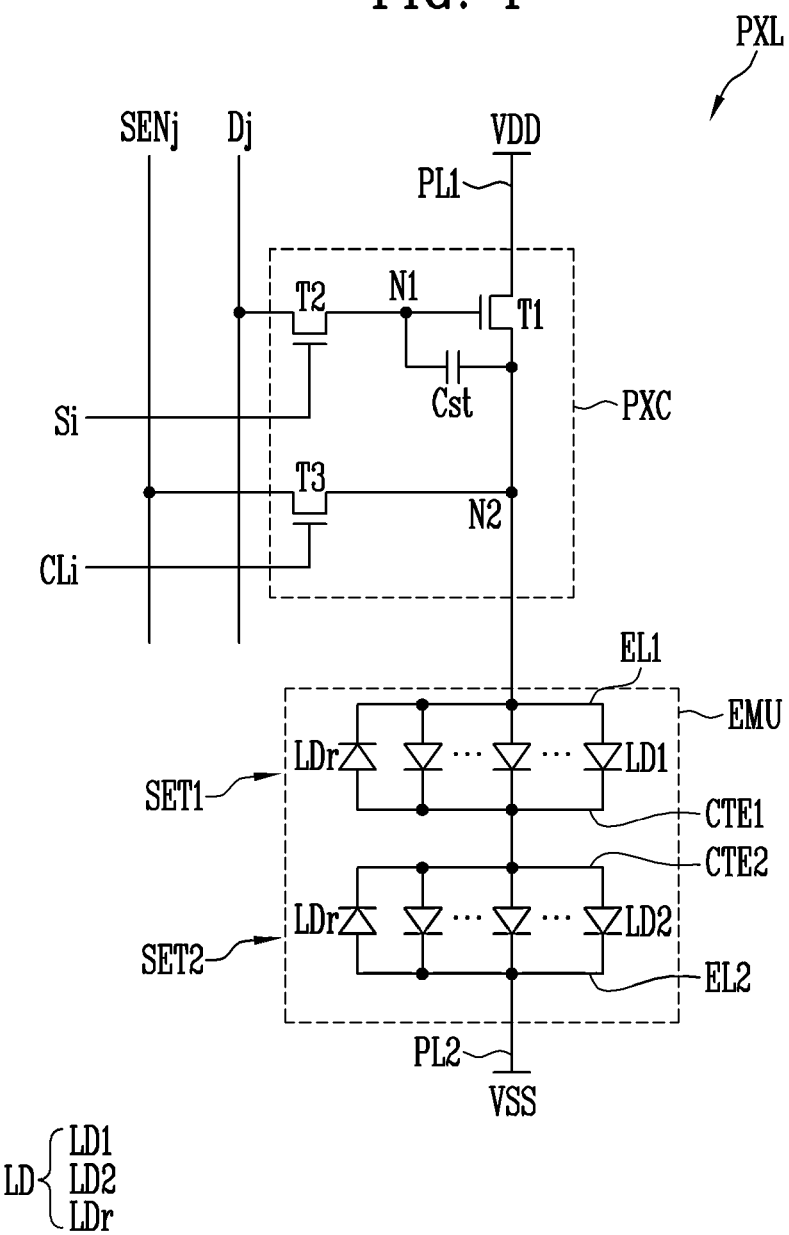
FIG. 4 is a circuit diagram of one pixel of a display device according to some embodiments.

FIG. 4 is a circuit diagram of one pixel of a display device according to some embodiments.

FIG. 4 illustrates a pixel PXL included in an i-th pixel row and a j-th pixel column (where, i and j are positive integers).

Referring to FIG. 4, the pixel PXL may include a driving circuit PXC and a light emitting unit EMU.

The driving circuit PXC may include a first transistor T1, a second transistor T2, a third transistor T3, and a storage capacitor Cst.

A first electrode of the first transistor T1 (or a driving transistor) may be connected to a first power line PL1, and a second electrode may be connected to a first electrode EL1 of the light emitting unit EMU (or a second node N2). A gate electrode of the first transistor T1 may be connected to a first node N1. In one or more embodiments, the first electrode may be a drain electrode, and the second electrode may be a source electrode.

The first transistor T1 may control a current amount of a driving current flowing into the light emitting unit EMU in response to a voltage of the first node N1. According to one or more embodiments, the first transistor T1 may selectively include a bottom metal layer. The gate electrode and the bottom metal layer of the first transistor T1 may overlap each other with an insulating layer interposed therebetween. In addition, according to some embodiments, a threshold voltage of the first transistor T1 may be moved in a negative direction or a positive direction by applying a source-sink technique by connecting the bottom metal layer to the second electrode of the first transistor T1.

A first electrode of the second transistor T2 (or a switching transistor) may be connected to a data line Dj, and a second electrode may be connected to the first node N1 (or the gate electrode of the first transistor T1). A gate electrode of the second transistor T2 may be connected to a first scan line Si. The second transistor T2 may be turned on when a first scan signal (for example, a high level voltage) is supplied to the first scan line Si to transmit a data voltage from the data line Dj to the first node N1.

A first electrode of the third transistor T3 may be connected to a sensing line SENj, and a second electrode may be connected to the second node N2 (or the second electrode of the first transistor T1). A gate electrode of the third transistor T3 may be connected to a second scan line CLi. The third transistor T3 may be turned on when a second scan signal (for example, a high level voltage) is supplied to the second scan line CLi during a sensing period (e.g., a predetermined sensing period), to electrically connect the sensing line SENj and the second node N2.

The storage capacitor Cst is connected between the first node N1 and the second node N2. The storage capacitor Cst may charge a data voltage corresponding to a data signal supplied to the first node N1 during one frame. Accordingly, the storage capacitor Cst may store a voltage corresponding to a voltage difference between the first node N1 and the second node N2. For example, the storage capacitor Cst may store a voltage corresponding to a difference between a data voltage supplied to the gate electrode of the first transistor T1, and an initialization voltage supplied to the second electrode of the first transistor T1.

The light emitting unit EMU may include a first series stage SET1 and a second series stage SET2 connected in series between the first power line PL1, to which a first driving voltage VDD is applied, and the second power line PL2, to which a second driving voltage VSS is applied. Each of the first series stage SET1 and the second series stage SET2 may include a plurality of light emitting elements LD connected in parallel.

The first series stage SET1 may include a first electrode EU, a first intermediate electrode CTE1, and at least one first light emitting element LD1 connected between the first electrode EL1 and the first intermediate electrode CTE1. In addition, the first series stage SET1 may include a reverse light emitting element LDr connected in a direction that is opposite to the first light emitting element LD1 between the first electrode EU and the first intermediate electrode CTE1.

The second series stage SET2 may include a second intermediate electrode CTE2, a second electrode EL2, and at least one second light emitting element LD2 connected between the second intermediate electrode CTE2 and the second electrode EL2. In addition, the second series stage SET2 may include a reverse light emitting element LDr connected in a direction that is opposite to the second light emitting element LD2 between the second intermediate electrode CTE2 and the second electrode EL2.

The first electrode EL1 of the first series stage SET1 may be an anode of the light emitting unit EMU of each pixel PXL, and the second electrode EL2 of the second series stage SET2 may be a cathode of the light emitting unit EMU.

In FIG. 4, the transistor is shown as an NMOS, but the disclosure is not limited thereto. For example, at least one of the first, second, and third transistors T1, T2, and T3 may be implemented as a PMOS. In addition, the first, second, and third transistors T1, T2, and T3 shown in FIG. 4 may be thin film transistors including at least one of an oxide semiconductor, an amorphous silicon semiconductor, or a polycrystalline silicon semiconductor.

Hereinafter, a light emitting element included in a display device according to some embodiments is described with reference to FIG. 5.

Figure 5:
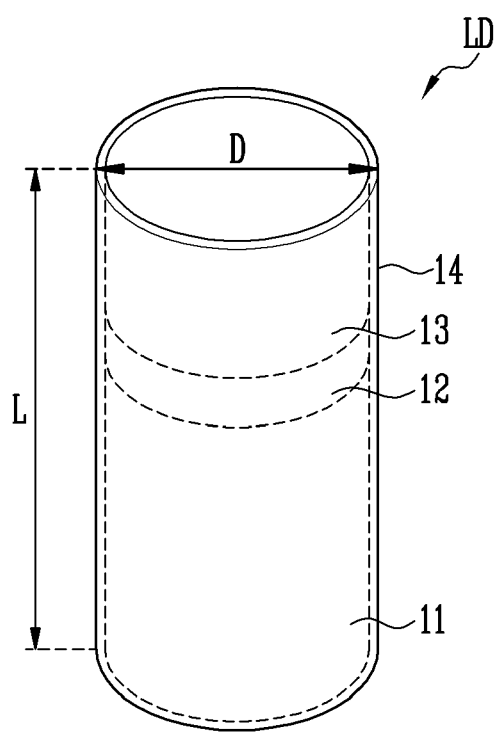
FIG. 5 is a perspective view illustrating a light emitting element included in one pixel of a display device according to some embodiments.

FIG. 5 is a perspective view illustrating a light emitting element included in one pixel of a display device according to some embodiments.

Referring to FIG. 5, the light emitting element LD according to some embodiments includes a first semiconductor layer 11, an active layer 12, and a second semiconductor layer 13.

For example, the light emitting element LD may be configured as a stack in which the first semiconductor layer 11, the active layer 12, and the second semiconductor layer 13 are sequentially stacked along a length L direction.

The first semiconductor layer 11 may include at least one n-type semiconductor layer. For example, the first semiconductor layer 11 may include any one semiconductor material among InAlGaN, GaN, AlGaN, InGaN, AlN, and InN, and may include an n-type semiconductor layer doped with a first conductive dopant such as Si, Ge, or Sn. However, the material configuring the first semiconductor layer 11 is not limited thereto, and various other materials may configure the first semiconductor layer 11.

The active layer 12 may be located on the first semiconductor layer 11 and may be formed in a single or multiple quantum well structure. In one or more embodiments, a clad layer doped with a conductive dopant may be formed on and/or under the active layer 12. For example, the clad layer may be formed of an AlGaN layer or an InAlGaN layer. According to one or more embodiments, a material such as AlGaN or InAlGaN may be used to form the active layer 12, and various other materials may configure the active layer 12. When a voltage equal to or greater than a threshold voltage is applied to both ends of the light emitting element LD, the light emitting element LD emits light while electron-hole pairs are combined in the active layer 12. By controlling light emission of the light emitting element LD using such a principle, the light emitting element LD may be used as a light source of various light emitting devices including the pixel PXL of the display device.

The second semiconductor layer 13 may be located on the active layer 12, and may include a semiconductor layer of a type that is different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant such as Mg, Zn, Ca, Sr, or Ba. However, the material configuring the second semiconductor layer 13 is not limited thereto, and various other materials may configure the second semiconductor layer 13.

In the above-described embodiments, each of the first semiconductor layer 11 and the second semiconductor layer 13 is configured of one layer, but the disclosure is not limited thereto. In one or more embodiments, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain alleviating layer located between semiconductor layers of which lattice structures are different to serve as a buffer for reducing a lattice constant difference. The TSBR layer may be configured of a p-type semiconductor layer such as p-GaInP, p-AlInP, or p-AlGaInP, but the disclosure is not limited thereto.

When an extension direction of the light emitting element LD is referred to as the length L direction, the light emitting element LD may have one end part and another end part along the length L direction. According to one or more embodiments, one of the first semiconductor layer 11 and the second semiconductor layer 13 may be located at one end part of the light emitting element LD, and the other of the first semiconductor layer 11 the second semiconductor layer 13 may be located at the other end part of the light emitting element LD.

According to one or more embodiments, the light emitting element LD may have a size as small as a nano scale to a micro scale. Each light emitting element LD may have a diameter D and/or a length L of a nano scale to micro scale range.

According to one or more embodiments, the light emitting element LD may be a rod-shaped light emitting diode manufactured in a rod shape. In the present specification, the term "rod-shaped" encompasses a rod-like shape or a bar-like shape that is long, or that extends, in the length L direction (that is, having an aspect ratio greater than 1), such as a circular column or a polygonal column, and a shape of a cross section thereof is not particularly limited. For example, the length L of the light emitting element LD may be greater than the diameter D (or a width of the cross section) thereof.

In FIG. 5, the light emitting element having a columnar shape is shown, but the type and/or the shape of the light emitting element according to the disclosure are/is not limited to that shown in the drawing.

In one or more embodiments, the light emitting element LD further includes an insulating layer 14 provided on a surface. The insulating layer 14 may be formed on the surface of the light emitting element LD to surround an outer circumferential surface of the active layer 12, and may further surround one region of the first semiconductor layer 11 and the second semiconductor layer 13. Referring to FIG. 5, in one or more embodiments, the insulating layer 14 might not cover, and may expose, one end of each of the first semiconductor layer 11 and the second semiconductor layer 13 positioned at respective ends of the light emitting element LD in the length L direction (for example, two base surfaces of a cylinder (e.g., an upper surface and a lower surface of the light emitting element LD)).

When the insulating layer 14 is provided on a surface of the light emitting element LD, for example, on a surface of the active layer 12, then a likelihood of the active layer 12 being shorted with at least one electrode or the like (for example, a contact electrode among contact electrodes connected to the both ends of the light emitting element LD) may be reduced or prevented. Accordingly, electrical stability of the light emitting element LD may be secured.

In one or more embodiments, the light emitting element LD may further include an additional component in addition to the first semiconductor layer 11, the active layer 12, the second semiconductor layer 13, and the insulating layer 14. For example, the light emitting element LD may additionally include one or more phosphor layers, active layers, semiconductor layers, and/or electrodes located on one end side of the first semiconductor layer 11, the active layer 12, and the second semiconductor layer 13.

Hereinafter, a cross-sectional view of a display device according to some embodiments is described with reference to FIG. 6.

Figure 6:
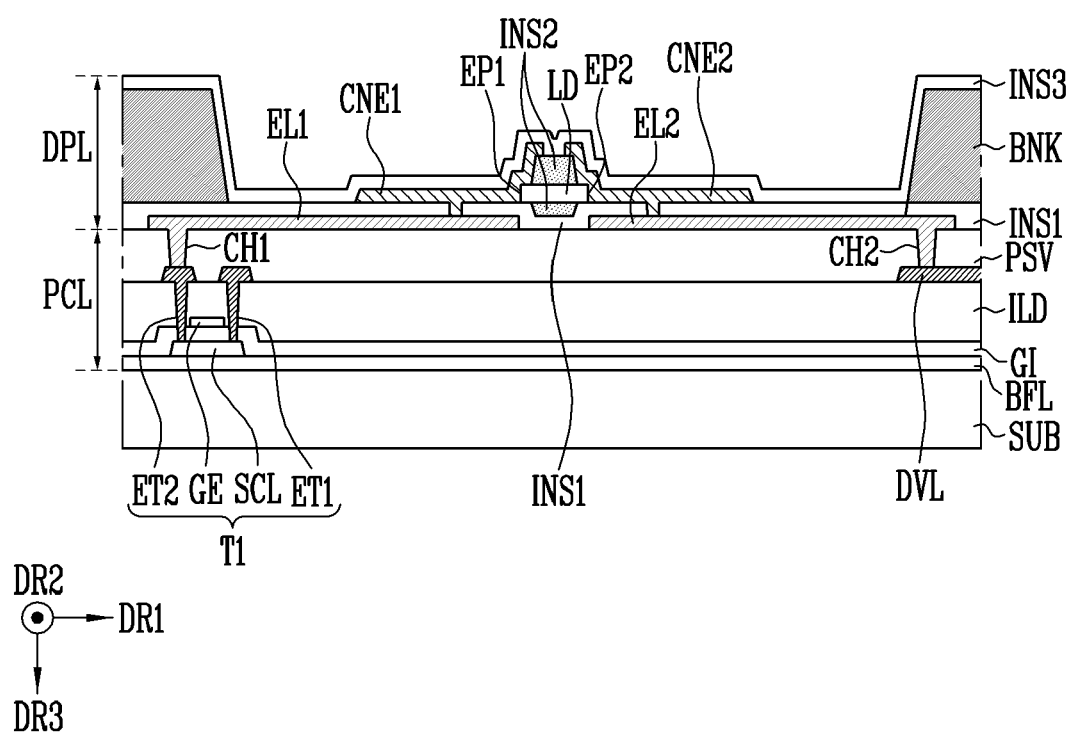
FIG. 6 is a schematic cross-sectional view of one pixel of a display device according to some embodiments.

FIG. 6 is a schematic cross-sectional view of one pixel of a display device according to some embodiments.

Referring to FIG. 6, the display device according to some embodiments may include a substrate SUB, and a pixel circuit layer PCL and a display element layer DPL positioned above one surface of the substrate SUB.

The substrate SUB may be a rigid substrate or a flexible substrate, and may be a substrate capable of transmitting light by including a transparent insulating material.

The pixel circuit layer PCL may include a buffer layer BFL, a first transistor T1, a plurality of insulating layers GI and ILD, a driving voltage line DVL, and a protective layer PSV.

The buffer layer BFL may reduce or prevent the likelihood of an impurity being diffused into the pixel circuit layer PCL. The buffer layer BFL may be an inorganic insulating layer including an inorganic material. For example, the buffer layer BFL may include at least one of a metal oxide such as silicon nitride (SiNx), silicon oxide (SiOx), silicon oxynitride (SiOxNy), or aluminum oxide (AlOx). The buffer layer BFL may be omitted according to the material, a process condition, and the like of the substrate SUB.

The first transistor T1 may include a semiconductor pattern SCL, a gate electrode GE, a drain electrode ET1, and a source electrode ET2. According to one or more embodiments, the drain electrode ET1 and the source electrode ET2 may be interchanged.

The semiconductor pattern SCL is positioned on the buffer layer BFL. The semiconductor pattern SCL may include a drain region connected to the drain electrode ET1, a source region connected to the source electrode ET2, and a channel region between the drain region and the source region. The channel region may overlap the gate electrode GE of the first transistor T1. The semiconductor pattern SCL may be a semiconductor pattern formed of polysilicon, amorphous silicon, an oxide semiconductor, or the like.

The gate insulating layer GI is positioned on the semiconductor pattern SCL to cover the semiconductor pattern SCL and the buffer layer BFL. The gate insulating layer GI may be an inorganic insulating layer including an inorganic material. For example, the gate insulating layer GI may include at least one of a metal oxide, such as silicon nitride (SiNx), silicon oxide (SiO$_x$), silicon oxynitride (SiO$_x$N$_y$), or aluminum oxide (AlO$_x$). According to one or more embodiments, the gate insulating layer GI may be formed of an organic insulating layer including an organic material. The gate insulating layer GI may be provided as a single layer, or may be provided as multiple layers of a double layer or more.

The gate electrode GE is positioned on the gate insulating layer GI to overlap the channel region of the semiconductor pattern SCL. The gate electrode GE may be configured as a single layer including a material selected from a group consisting of copper (Cu), molybdenum (Mo), tungsten (W), aluminum neodymium (AlNd), titanium (Ti), aluminum (Al), silver (Ag), or an alloy thereof alone or a mixture thereof. In addition, the gate electrode GE may be configured in a double layer or multi-layer structure of molybdenum (Mo), titanium (Ti), copper (Cu), aluminum (Al), or silver (Ag), which is a low-resistance material.

The interlayer insulating layer ILD is positioned on the gate electrode GE to cover the gate electrode GE and the gate insulating layer GI. The interlayer insulating layer ILD may include the same material as the gate insulating layer GI, or may include one or more materials selected from materials exemplified as a configuration material of the gate insulating layer GI.

The interlayer insulating layer ILD may include a contact, or a contact hole(s), for connecting the drain electrode ET1 of the first transistor T1 and the source electrode ET2 of the first transistor T1 to the drain region and the source region of the semiconductor pattern SCL, respectively.

The drain electrode ET1 of the first transistor T1, the source electrode ET2 of the first transistor T1, and the driving voltage line DVL are located on the interlayer insulating layer ILD. Here, all of the drain electrode ET1 of the first transistor T1, the source electrode ET2 of the first transistor T1, and the driving voltage line DVL positioned on the interlayer insulating layer ILD may be referred to as a data conductive layer.

The drain electrode ET1 and the source electrode ET2 may be connected to the source region and the drain region of the semiconductor pattern SCL through contact holes that sequentially pass through the gate insulating layer GI and the interlayer insulating layer ILD, respectively. The drain electrode ET1 may be the same configuration as the first electrode of the first transistor T1 described with reference to FIG. 4, and the source electrode ET2 may be the same configuration as the second electrode of the first transistor T1 described with reference to FIG. 4.

The driving voltage line DVL may be the same configuration as the second power line PL2 described with reference to FIG. 4. Accordingly, the second driving voltage VSS may be applied to the driving voltage line DVL. In some embodiments, the pixel circuit layer PCL may further include a first power line connected to first driving power.

The protective layer PSV is positioned on the drain electrode ET1 and the source electrode ET2 of the first transistor T1, and on the driving voltage line DVL to cover the drain electrode ET1 and the source electrode ET2 of the first transistor T1, the driving voltage line DVL, and the interlayer insulating layer ILD.

The protective layer PSV may include an inorganic insulating layer and/or an organic insulating layer. The inorganic insulating layer may include at least one of a metal oxide such as silicon oxide (SiOx), silicon nitride (SiNx), silicon oxynitride (SiOxNy), or aluminum oxide (AlOx). The organic insulating layer may include at least one of acrylic resin (polyacrylates resin), epoxy resin, phenolic resin, polyamides resin, polyimides rein, unsaturated polyester resin, polyphenylene ethers resin, polyphenylene sulfides resin, or benzocyclobutene resin.

The protective layer PSV includes a first contact hole CH1 exposing the source electrode ET2 of the first transistor T1, and a second contact hole CH2 exposing the driving voltage line DVL. The source electrode ET2 of the first transistor T1 may be physically and/or electrically connected to the first electrode EL1 through the first contact hole CH1. The driving voltage line DVL may be physically and/or electrically connected to the second electrode EL2 through the second contact hole CH2.

The display element layer DPL is positioned on the protective layer PSV.

The display element layer DPL may include the first electrode EL1, the second electrode EL2, a bank BNK, the light emitting element LD, a first contact electrode CNE1, a second contact electrode CNE2, and a plurality of insulating layers INS1, INS2, and INS3.

The first electrode EL1 and the second electrode EL2 are located on the protective layer PSV.

Each of the first electrode EL1 and the second electrode EL2 may be formed of a material having a constant reflectance so that light emitted from the light emitting element LD proceeds in an image display direction (for example, a third direction DR3, or a direction opposite thereto) of the display device. For example, each of the first electrode EU and the second electrode EL2 may be configured of a single layer including a conductive oxide, such as indium tin oxide (ITO), indium zinc oxide (IZO), zinc oxide (ZnO), and indium gallium zinc oxide (IGZO), or indium tin zinc oxide (ITZO), a conductive polymer, such as poly(3,4-ethylenedioxythiophene) (PEDOT), or the like. In addition, each of the first electrode EL1 and the second electrode EL2 may be configured of multiple layers that further include at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, and an alloy thereof.

The first electrode EL1 may be physically and/or electrically connected to the source electrode ET2 of the first transistor T1 through the first contact hole CH1.

The second electrode EL2 may be physically and/or electrically connected to the driving voltage line DVL through the second contact hole CH2.

The first insulating layer INS1 is located on the protective layer PSV to cover at least a part of the first electrode EL1, the second electrode EL2, and the protective layer PSV. The first insulating layer INS1 may be positioned between the first electrode EL1 and the second electrode EL2 to reduce or prevent the likelihood of the first electrode EL1 and the second electrode EL2 being electrically shorted to each other.

The first insulating layer INS1 may include an inorganic insulating layer formed of an inorganic material, or an organic insulating layer formed of an organic material. For example, the first insulating layer INS1 may include at least one of a metal oxide such as silicon nitride (SiNx), silicon oxide (SiOx), silicon oxynitride (SiOxNy), or aluminum oxide (AlOx), but the disclosure is not limited thereto. The first insulating layer INS1 may be formed of an inorganic insulating layer or an organic insulating layer suitable for protecting the light emitting elements LD from the pixel circuit layer PCL.

The light emitting element LD is positioned on the first insulating layer INS1. A first end part EP1 of the light emitting element LD is positioned to face the first electrode EL1, and a second end part EP2 of the light emitting element LD is positioned to face the second electrode EL2. Accordingly, the light emitting element LD may receive the first driving voltage VDD through the first end part EP1, and may receive the second driving voltage VSS through the second end part EP2.

The bank BNK is positioned on the first insulating layer INS1. The bank BNK may be a dam structure that reduces or prevents the likelihood of a solution including the light emitting elements LD flowing into an emission area of an adjacent pixel PXL, or may allow for the control of the supply of an amount (e.g., a predetermined amount) of solution to each emission area in an operation of supplying the light emitting elements LD to the emission area.

The bank BNK may be configured to include a light blocking material and/or a reflective material to reduce or prevent a light leakage defect in which light leaks between each pixel PXL and respective pixels PXL adjacent thereto. According to one or more embodiments, the bank BNK may include a transparent material. For example, the bank BNK may include a polyamides resin, a polyimides resin, and the like, but the disclosure is not limited thereto. According to other embodiments, a reflective material layer may be separately provided and/or formed on the bank BNK to further improve efficiency of light emitted from the pixel PXL.

Is some embodiments, the bank BNK is positioned on the first insulating layer INS1, but the disclosure is not limited thereto. According to one or more embodiments, the bank BNK may be positioned on an upper surface of the protective layer PSV, and may be positioned to at least partially overlap the first electrode EL1 and the second electrode EL2.

The second insulating layer INS2 may be positioned on the light emitting element LD. The second insulating layer INS2 may be positioned on a part of an upper surface of the light emitting element LD so that the first end part EP1 and the second end part EP2 of the light emitting element LD are exposed to an outside. The light emitting elements LD may be secured in an aligned position by positioning the second insulating layer INS2 on the light emitting elements LD after the alignment of the light emitting elements LD is completed in the pixel area PXA.

The second insulating layer INS2 may be formed of an organic insulating layer including an organic material according to a design condition of the display device including the light emitting elements LD.

The second insulating layer INS2 may be configured as a single layer or multiple layers, and may include an inorganic insulating layer including at least one inorganic material, or an organic insulating layer including at least one organic material. For example, the second insulating layer INS2 may include at least one of a metal oxide such as silicon nitride (SiNx), silicon oxide (SiOx), silicon oxynitride (SiOxNy), or aluminum oxide (AlOx), but the disclosure is not limited thereto.

The first contact electrode CNE1 is positioned to at least partially overlap the first electrode EL1, the first insulating layer INS1, the light emitting element LD, and the second insulating layer INS2.

The first contact electrode CNE1 may directly contact the first end part EP1 of the light emitting element LD and the first electrode EL1, and may stably physically and/or electrically connect the first end part EP1 of the light emitting element LD to the first electrode EL1.

The first contact electrode CNE1 may include a transparent conductive material, such as indium tin oxide (ITO), indium zinc oxide (IZO), zinc oxide (ZnO), and indium gallium zinc oxide (IGZO).

The second contact electrode CNE2 is positioned to at least partially overlap the second electrode EL2, the first insulating layer INS1, the light emitting element LD, and the second insulating layer INS2.

The second contact electrode CNE2 may directly contact the second end part EP2 of the light emitting element LD and the second electrode EL2, and stably physically and/or electrically connect the second end part EP2 of the light emitting element LD to the second electrode EL2.

The second contact electrode CNE2 may include a transparent conductive material, such as indium tin oxide (ITO), indium zinc oxide (IZO), zinc oxide (ZnO), and indium gallium zinc oxide (IGZO), and the like.

The third insulating layer INS3 is positioned on the second insulating layer INS2, the first contact electrode CNE1, the second contact electrode CNE2, and the bank BNK to cover at least a part of the second insulating layer INS2, the first contact electrode CNE1, the second contact electrode CNE2, and the bank BNK.

The third insulating layer INS3 may be an inorganic insulating layer including an inorganic material, or an organic insulating layer including an organic material. For example, the third insulating layer INS3 may include at least one of a metal oxide, such as silicon nitride (SiNx), silicon oxide (SiOx), silicon oxynitride (SiOxNy), or aluminum oxide (AlOx), but the disclosure is not limited thereto.

In addition, the third insulating layer INS3 may have a structure in which at least one inorganic insulating layer and at least one organic insulating layer is alternately stacked. The third insulating layer INS3 may entirely cover the display element layer DPL to reduce or prevent water or moisture from flowing into the display element layer DPL including the light emitting elements LD from the outside.

Is some embodiments, the first contact electrode CNE1 and the second contact electrode CNE2 are positioned on the same layer by the same process, but the disclosure is not limited thereto. According to one or more embodiments, the first contact electrode CNE1 and the second contact electrode CNE2 may be positioned on different layers with the third insulating layer INS3 interposed therebetween.

According to one or more embodiments, the display element layer DPL may be configured to selectively further include an optical layer in addition to the third insulating layer INS3. For example, the display element layer DPL may further include a color conversion layer including color conversion particles that convert the light emitted from the light emitting elements LD into light of a corresponding color.

According to other embodiments, at least one overcoat layer (for example, a layer for planarizing an upper surface of the display element layer DPL) may be further located on the third insulating layer INS3.

Hereinafter, a pixel structure of a display device according to some embodiments is described with reference to FIGS. 7 to 11.

Figure 7:
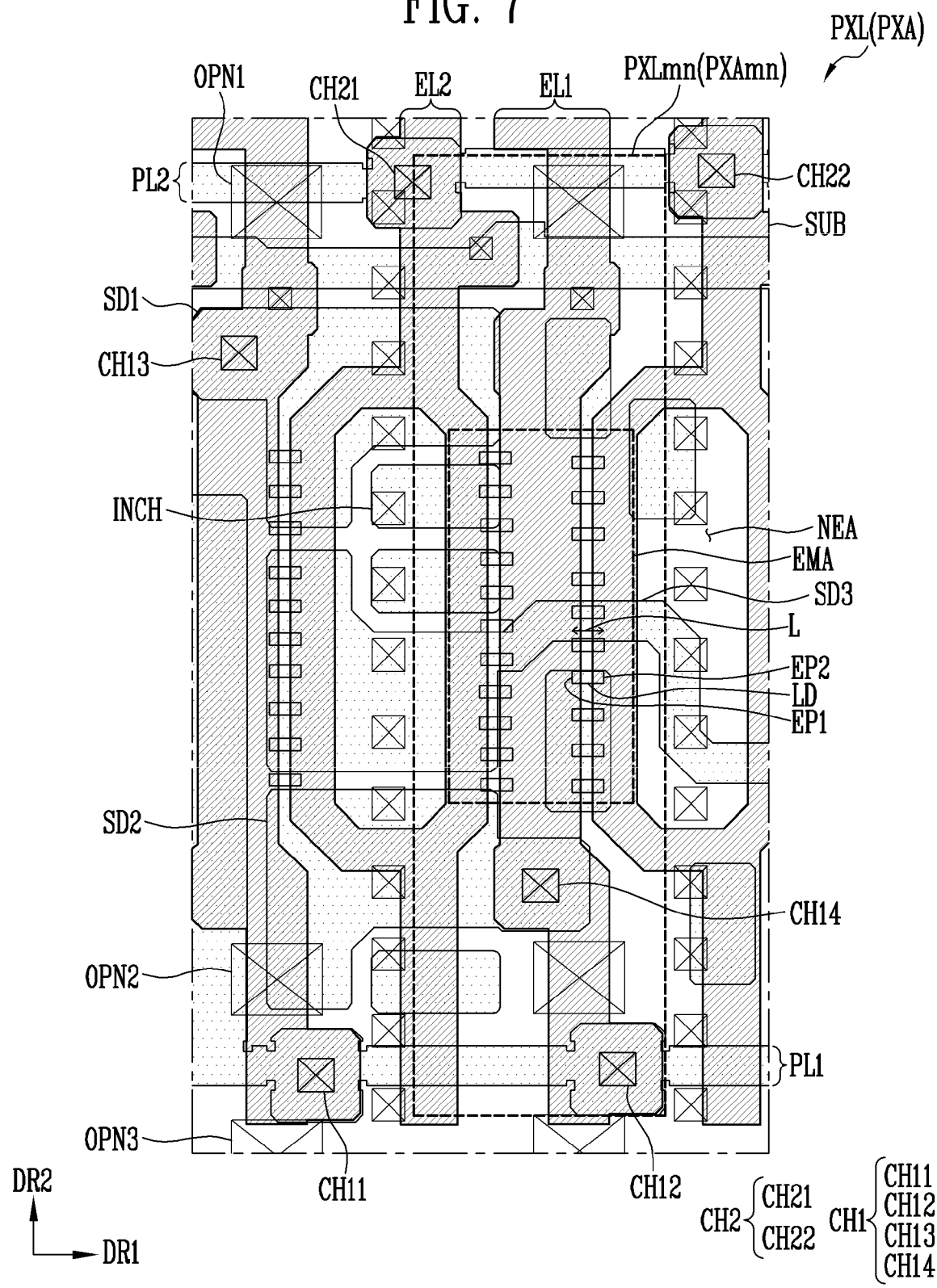
FIG. 7 is a schematic plan view of a pixel of a display device according to some embodiments.
Figure 8:
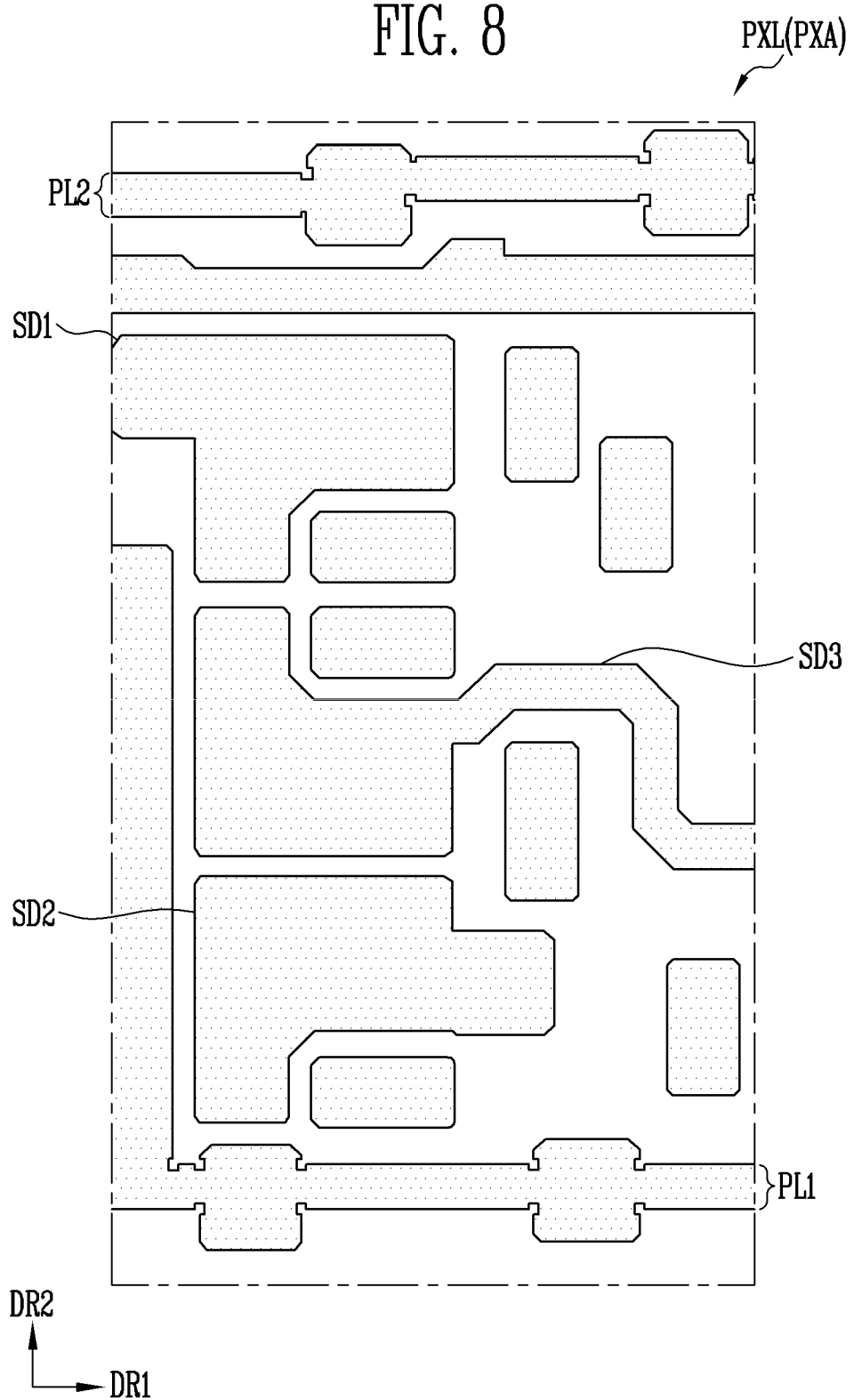
FIG. 8 is a plan view mainly illustrating a data conductive layer in the plan view of FIG. 7.
Figure 9:
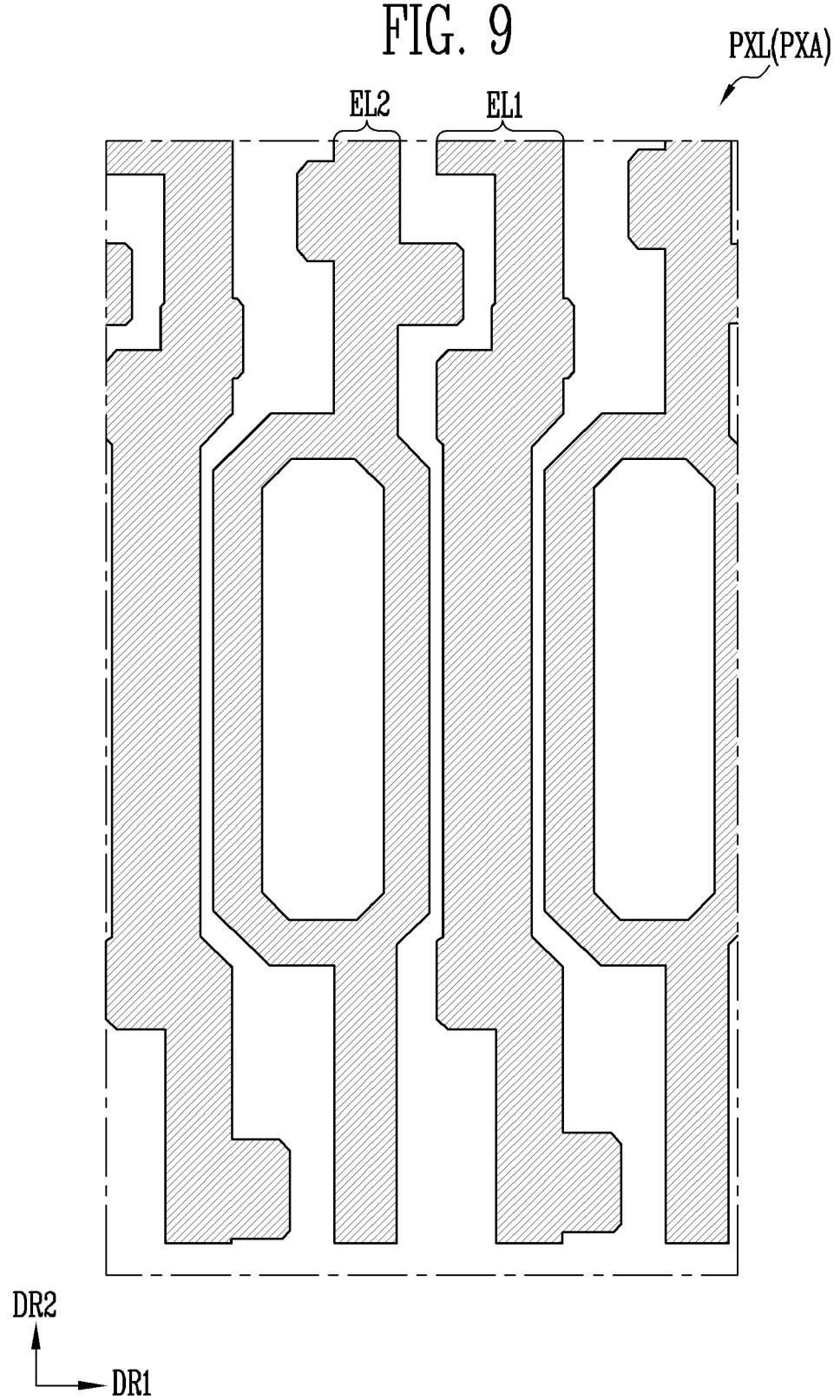
FIG. 9 is a plan view mainly illustrating a first electrode and a second electrode in the plan view of FIG. 7.
Figure 10:
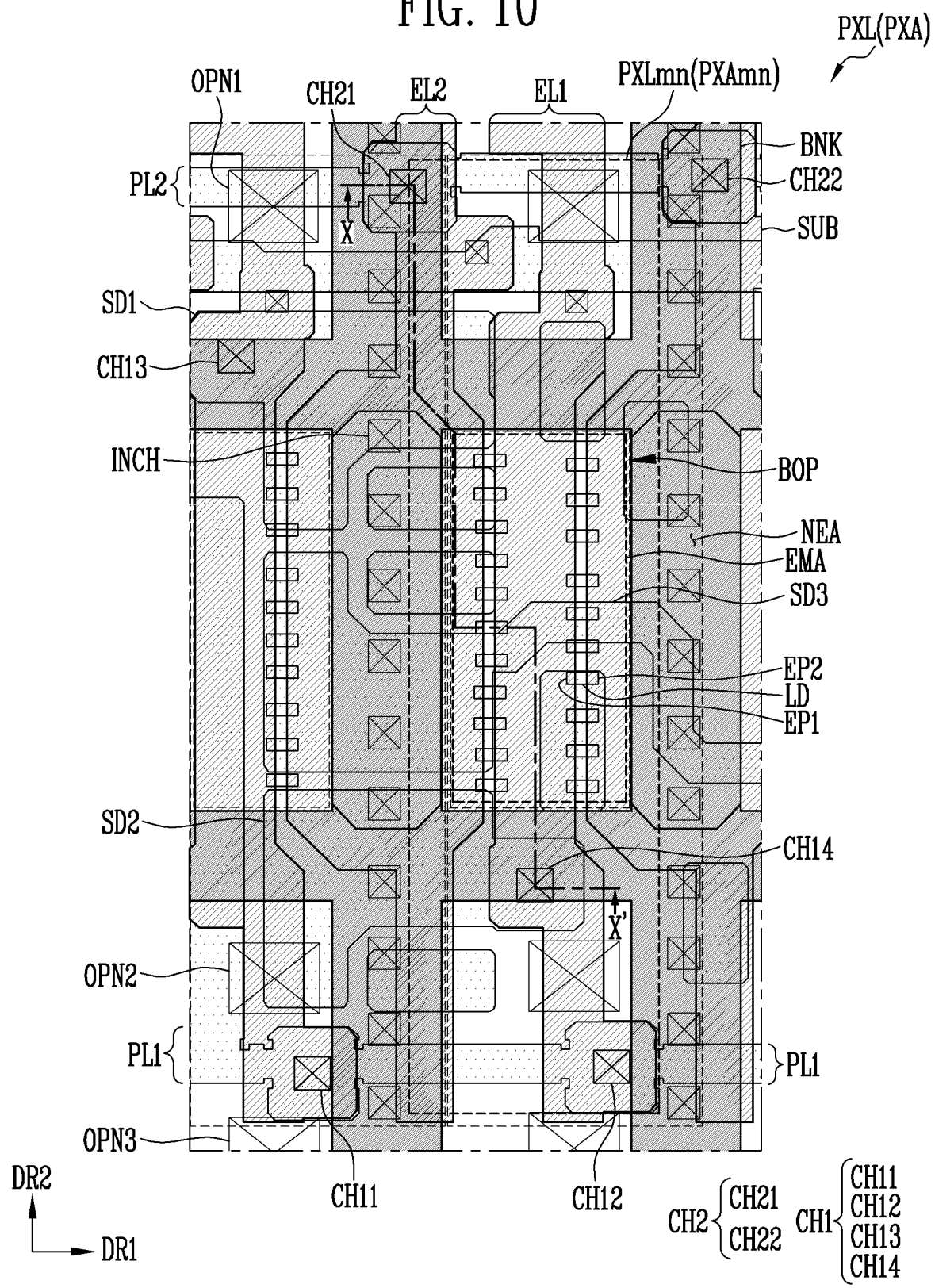
FIG. 10 is a plan view additionally illustrating a bank in the plan view of FIG. 7.
Figure 11:
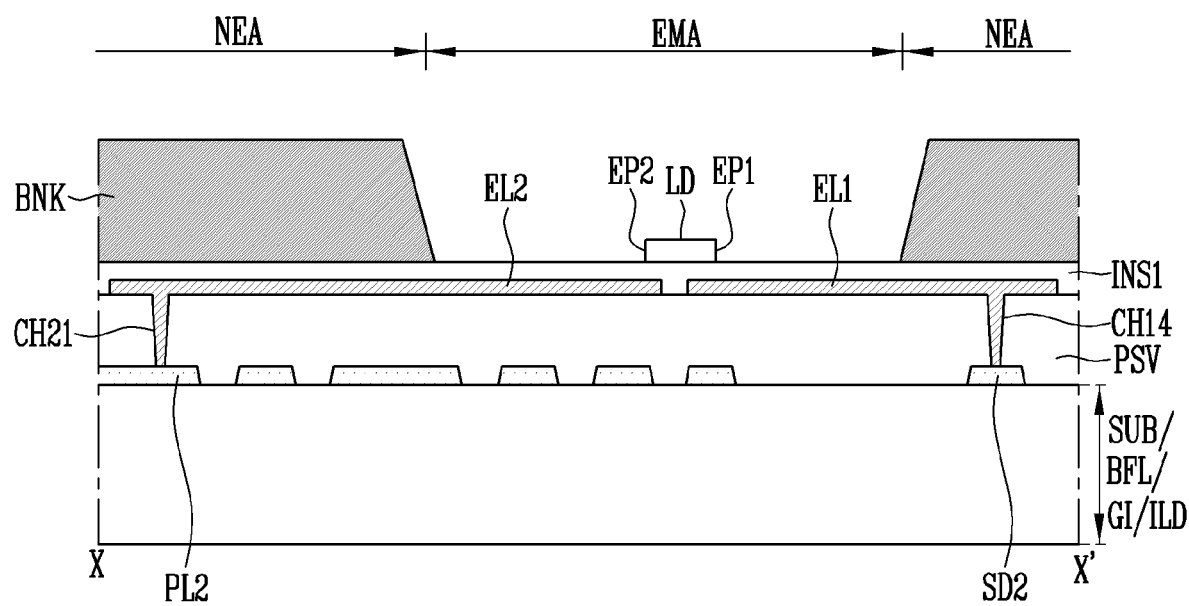
FIG. 11 is a cross-sectional view taken along the line X-X' of FIG. 10.

FIG. 7 is a schematic plan view of a pixel of a display device according to some embodiments, FIG. 8 is a plan view mainly illustrating a data conductive layer in the plan view of FIG. 7, FIG. 9 is a plan view mainly illustrating a first electrode and a second electrode in the plan view of FIG. 7, FIG. 10 is a plan view additionally illustrating a bank in the plan view of FIG. 7, and FIG. 11 is a cross-sectional view taken along the line X-X' of FIG. 10.

In FIGS. 7 to 10, transistors electrically connected to the light emitting elements LD and signal lines connected to the transistors are omitted for convenience.

To describe aspects of the disclosure, FIGS. 7 to 10 mainly show the data conductive layer that is a part of the pixel circuit layer PCL, the first electrode EL1 that is a part of the display element layer DPL, the second electrode EL2, the light emitting elements LD, and the bank BNK described with reference to FIG. 6.

In addition, FIGS. 7 to 10 mainly show a partial pixel area PXA including a pixel PXLmn (or one pixel area PXAmn) included in an m-th pixel row and an n-th pixel column of the display device.

Referring to FIGS. 7 to 10, the display device according to some embodiments may include the data conductive layer, the first electrode EL1, the second electrode EL2, and the bank BNK.

The data conductive layer may include the first power line PL1, the second power line PL2, a first data conductor SD1, a second data conductor SD2, and a third data conductor SD3.

The first power line PL1 may be positioned under one pixel area PXAmn and may extend in a first direction DR1. In addition, the first power line PL1 may extend in a second direction DR2 in the partial pixel area PXA. The first power line PL1 may have the same configuration as the first line SGL1 described with reference to FIG. 2, or may have a configuration electrically connected to the first line SGL1. Accordingly, the first alignment signal or the first driving voltage supplied to the first line SGL1 may be applied to the first power line PL1. In addition, the first power line PL1 may have the same configuration as the first power line PL1 described with reference to FIG. 4. Accordingly, the first driving voltage VDD may be transmitted to the pixels PXL through the first power line PL1.

The first power line PL1 may be electrically connected to the first electrode EL1 to be described later through an eleventh contact hole CH11 and a twelfth contact hole CH12.

The second power line PL2 may be positioned on one pixel area PXAmn and may extend in the first direction DR1. The second power line PL2 may have the same configuration as the second line SGL2 described with reference to FIG. 2, or may have a configuration electrically connected to the second line SGL 2. Accordingly, the second alignment signal or the second driving voltage supplied to the second line SGL2 may be applied to the second power line PL2. In addition, the second power line PL2 may have the same configuration as the second power line PL2 described with reference to FIG. 4. Accordingly, the second driving voltage VSS may be transmitted to the pixels PXL through the second power line PL2.

The second power line PL2 may be electrically connected to the second electrode EL2 to be described later through a twenty-first contact hole CH21 and a twenty-second contact hole CH22. Here, the twenty-first contact hole CH21 and the twenty-second contact hole CH22 may be referred to as the second contact hole CH2.

The first data conductor SD1 may be positioned at a central part of the partial pixel area PXA and may be positioned adjacent to the second power line PL2. The first data conductor SD1 may have a polygonal island shape. The first data conductor SD1 may at least partially overlap the first electrode EU, and may be electrically connected to the first electrode EL1 through a thirteenth contact hole CH13 at an overlapping part. The first data conductor SD1 may correspond to the first terminal of the first transistor T1 described with reference to FIG. 4. Accordingly, the first electrode EL1 may receive the first driving voltage VDD (refer to FIG. 4) through the first data conductor SD1.

The second data conductor SD2 may be positioned at a central part of the partial pixel area PXA, and may be positioned adjacent to the first power line PL1. The second data conductor SD2 may have a polygonal island shape. The second data conductor SD2 may at least partially overlap the first electrode EL1, and may be electrically connected to the first electrode EL1 through a fourteenth contact hole CH14 at an overlapping part. The second data conductor SD2 may correspond to the first terminal of the first transistor T1 described with reference to FIG. 4. Accordingly, the first electrode EL1 may receive the first driving voltage VDD (refer to FIG. 4) through the second data conductor SD2.

The third data conductor SD3 may be positioned at a central part of the partial pixel area PXA, and may be positioned between the first data conductor SD1 and the second data conductor SD2. The third data conductor SD3 may have a polygonal island shape including a curved part. The third data conductor SD3 may at least partially overlap the first electrode EU, and may be electrically connected to the first electrode EL1 through a sixteenth contact hole CH16 (shown in FIG. 12) at an overlapping part. The third data conductor SD3 may correspond to the first terminal of the first transistor T1 described with reference to FIG. 4. Accordingly, the first electrode EL1 may receive the first driving voltage VDD (refer to FIG. 4) through the third data conductor SD3.

That is, the first data conductor SD1, the second data conductor SD2, and the third data conductor SD3 may be configurations transmitting the first driving voltage VDD to the corresponding pixel PXL.

A configuration that is shown in FIGS. 7 to 10, not denoted by a reference numeral, and not described may corresponds a part of the data conductor. Because such a configuration has no great relation to the feature of the disclosure, a description thereof is omitted. Such a configuration may configure a transistor of the pixel circuit layer PCL described with reference to FIG. 6.

The first electrode EL1 may be positioned at a central part of one pixel area PXAmn, and may extend in the second direction DR2. The first electrode EL1 may have a long bar shape, and may include a part that is partially curved with respect to the first direction DR1 while extending in the second direction DR2.

The second electrode EL2 may be positioned on a side surface (or both sides) of one pixel area PXAmn, and may extend in the second direction DR2. The second electrode EL2 may be positioned to be spaced apart from, and located between, two adjacent first electrodes EL1. The second electrode EL2 may have a shape in which a long quadrangle bar and a ring of a quadrangle ellipse are combined, and the second electrode EL2 may be positioned so that the ring of the quadrangle ellipse surrounds a part of insulating openings INCH.

An alignment signal may be applied to each of the first electrode EU and the second electrode EL2. That is, the first electrode EL1 may be electrically connected to the first line SGL1 described with reference to FIG. 2 through the first power line PL1 to receive the first alignment signal (or the first alignment voltage). The second electrode EL2 may be electrically connected to the second line SGL2 described with reference to FIG. 2 through the second power line PL2 to receive the second alignment signal (or the second alignment voltage). Accordingly, the first electrode EL1 and the second electrode EL2 may be implemented as alignment electrodes (or alignment lines) for aligning the light emitting elements LD.

After the light emitting elements LD are aligned in one pixel area PXAmn, a part of the first electrode EL1 and/or the second electrode EL2 may be removed to be implemented as electrodes for transmitting a voltage of driving power in each pixel area PXAmn. That is, the first electrode EL1 may transmit the first driving voltage VDD (refer to FIG. 4), and the second electrode EL2 may transmit the second driving voltage VSS (refer to FIG. 4). Accordingly, each pixel PXLmn may reduce or prevent the likelihood of a pixel short defect that may occur due to proximity of the first electrode EL1 and the second electrode EL2 to each other.

The first electrode EL1 may at least partially overlap the data conductor, and may be electrically connected to the data conductor through the first contact hole CH1.

For example, the first electrode EL1 may at least partially overlap the first data conductor SD1 or the second data conductor SD2, and may be electrically connected to the first data conductor SD1 or the second data conductor SD2 through the thirteenth contact hole CH13 and the fourteenth contact hole CH14. In addition, the first electrode EU may at least partially overlap the first power line PL1, and may at least partially overlap the first power line PL1 through the eleventh contact hole CH11 and the twelfth contact hole CH12. Accordingly, the first driving voltage VDD (refer to FIG. 4) may be transmitted to the first electrode EL1.

The eleventh contact hole CH11, the twelfth contact hole CH12, the thirteenth contact hole CH13, and the fourteenth contact hole CH14 described above, and a fifteenth contact hole CH15 (refer to FIG. 12) and a sixteenth contact hole CH16 (refer to FIG. 12) may be collectively referred to as the first contact hole CH1.

The first contact hole CH1 may be provided at various points where the first electrode EL1 and the data conductor overlap. Accordingly, even though a part of the first electrode EL1 is removed, the first driving voltage VDD (refer to FIG. 4) may be stably transmitted to the remaining part of the first electrode EU. For example, even though a part of the first electrode EL1 is removed through a first opening OPN1, a second opening OPN2, and a third opening OPN3 provided on the first electrode EU, the first driving voltage VDD (refer to FIG. 4) may be transmitted to the pixel area PXA through the thirteenth contact hole CH13 provided in the remaining part of the first electrode EL1 located between the first opening OPN1 and the second opening OPN2.

The second electrode EL2 may at least partially overlap the second power line PL2, and may be electrically connected to the second power line PL2 through the twenty-first contact hole CH21 and the twenty-second contact hole CH22. Accordingly, the second driving voltage VSS (refer to FIG. 4) may be transmitted to the second electrode EL2.

The light emitting elements LD may be positioned between the first electrode EL1 and the second electrode EL2 so that the length L direction is parallel to the first direction DR1. That is, when the alignment signal (or the alignment voltage) is applied to the first electrode EL1 and the second electrode EL2, the light emitting elements LD may be aligned between the first electrode EL1 and the second electrode EL2 so that the length L direction is parallel to the first direction DR1.

The first end part EP1 of the light emitting element LD may be aligned to face the first electrode EL1, and the second end part EP2 of the light emitting element LD may be aligned to face the second electrode EL2.

The first end part EP1 of the light emitting element LD may at least partially overlap the first electrode EL1, and the second end part EP2 of the light emitting element LD may at least partially overlap the second electrode EL2.

The bank BNK may be positioned in a non-emission area NEA in the partial pixel areas PXA. The bank BNK may be a structure defining (or partitioning) the pixel area PXAmn and/or an emission area EMA of each of the pixels PXLmn in one pixel PXLmn and adjacent pixels adjacent thereto. In one or more embodiments, the bank BNK may be a pixel defining layer or a dam structure that defines an area to which the light emitting elements LD are to be supplied in a process of supplying the light emitting elements LD to each pixel PXLmn. For example, as the emission area EMA of each pixel PXLmn is partitioned by the bank BNK, a mixed solution (for example, ink) including a desired amount and/or type of the light emitting device LD may be supplied (or input) to the emission area EMA.

The bank BNK may include at least one opening exposing configurations positioned under the bank BNK in the pixel area PXA. For example, the bank BNK may include an opening BOP exposing configurations positioned under the bank BNK. The opening BOP of the bank BNK may correspond to the emission area EMA. The light emitting elements LD, a part of the first electrode EL1, a part of the second electrode EL2, and a part of the data conductive layer may be positioned in the opening BOP.

FIG. 11 mainly shows the data conductive layer and the protective layer PSV which are parts of the pixel circuit layer PCL described with reference to FIG. 6, the first electrode EL 1, which is a part of the display element layer OPL, the second electrode EL2, the first insulating layer INS1, the light emitting elements LO, and the bank BNK prior to the formation of other portions of the display device to describe a feature of the disclosure. Accordingly, a description repetitive to that of FIG. 6 is omitted.

Referring to FIG. 11, a display device according to some embodiments may include the data conductive layer, the protective layer PSV, the first electrode EL1, the second electrode EL2, the first insulating layer INS1, the light emitting elements LD, and the bank BNK.

The data conductive layer may be positioned on an interlayer insulating layer ILD, and may include the second data conductor SD2 and the second power line PL2.

The protective layer PSV may be positioned on the data conductive layer and the interlayer insulating layer ILD to cover the data conductive layer.

The second data conductor SD2 may be physically and/or electrically connected to the first electrode EL1 through the fourteenth contact hole CH14 passing through the protective layer PSV. In addition, the second power line PL2 may be physically and/or electrically connected to the second electrode EL2 through the twenty-first contact hole CH21 passing through the protective layer PSV.

The first electrode EL1 and the second electrode EL2 may be positioned on the protective layer PSV.

The first insulating layer INS1 may be positioned on the first electrode EL1, the second electrode EL2, and the protective layer PSV to cover the first electrode EL1, the second electrode EL2, and the protective layer PSV. In some embodiments, the first insulating layer INS1 may include an opening to partially expose an upper surface of the first electrode EL1 and an upper surface of the second electrode EL2. The first electrode EL1 and the second electrode EL2 exposed by the first insulating layer INS1 may be electrically connected to a contact electrode.

The bank BNK and the light emitting element LD may be positioned on the first insulating layer INS1. The light emitting element LD may be positioned between the two banks BNK spaced apart from each other.

In some embodiments, an insulating layer may be positioned on the bank BNK and the light emitting element LD to cover the bank BNK and the light emitting element LD. The insulating layer may expose a part of the first end part EP1 or the second end part EP2 of the light emitting element LD.

In addition, in some embodiments, a contact electrode may be positioned on the insulating layer. The contact electrode may include a first contact electrode and a second contact electrode. The first contact electrode may be positioned to contact the first end part EP1 of the light emitting element LD exposed by the insulating layer, and the second contact electrode may be positioned to contact the second end part EP2 exposed by the insulating layer. Accordingly, the first end part EP1 of the light emitting element LD may receive a voltage of the first driving power, and the second end part EP2 of the light emitting element LD may receive a voltage of the second driving power.

Hereinafter, a plurality of pixels of a display device according to some embodiments is described with reference to FIG. 12.

Figure 12:
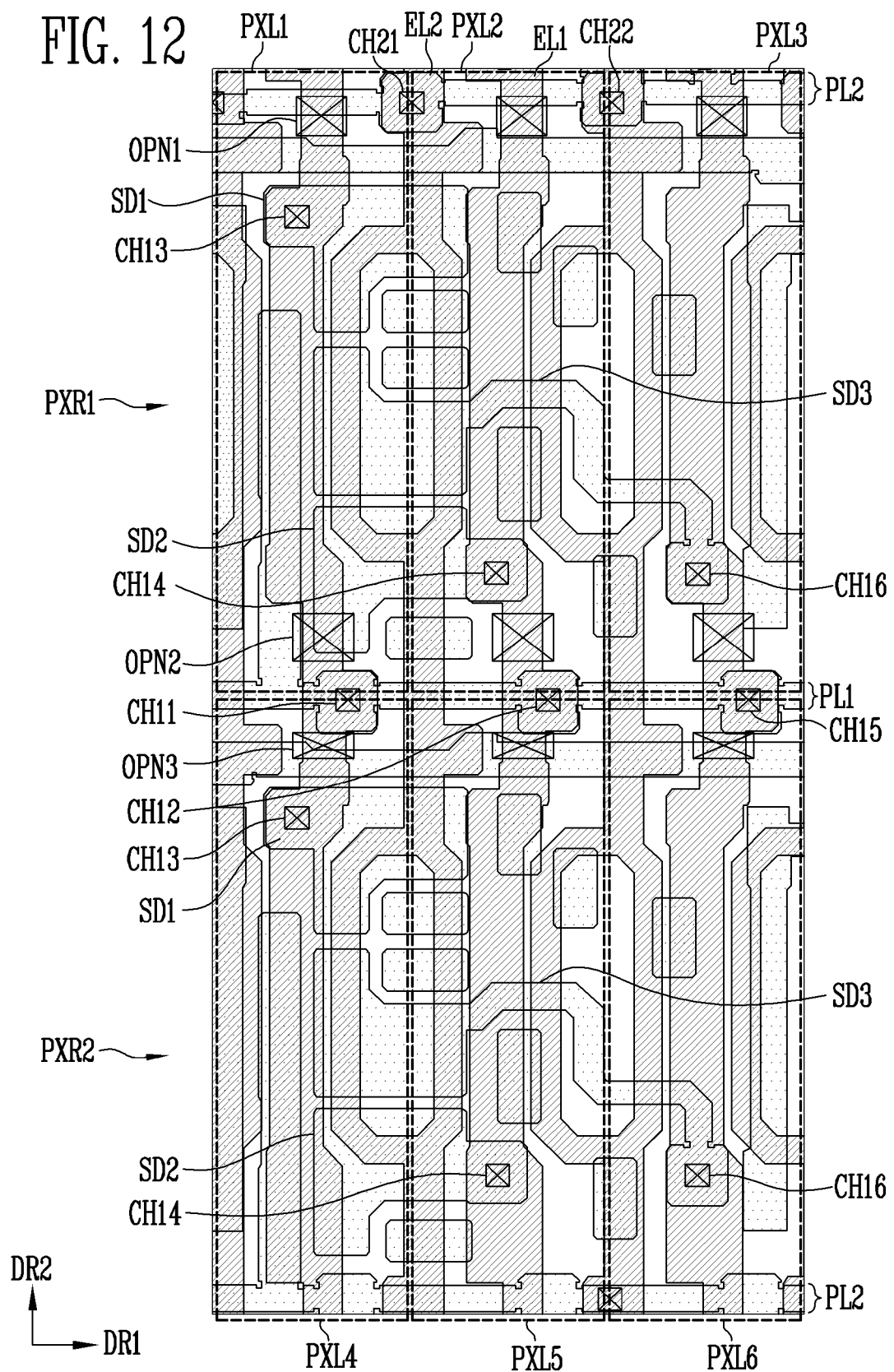
FIG. 12 is a plan view illustrating a plurality of pixels of a display device according to some embodiments.

FIG. 12 is a plan view illustrating a plurality of pixels of a display device according to some embodiments.

FIG. 12 mainly shows the data conductive layer, the first electrode EL1, and the second electrode EL2 described with reference to FIGS. 7 to 10. Therefore, a description repetitive to that of FIGS. 7 to 10 is omitted.

Referring to FIG. 12, the display device according to some embodiments may include a first pixel PXL1, a second pixel PXL2, a third pixel PXL3, a fourth pixel PXL4, a fifth pixel PXL5, and a sixth pixel PXL6.

The first pixel PXL1, the second pixel PXL2, and the third pixel PXL3 may be positioned parallel to each other in the first direction DR1 in a first pixel row PXR1. The fourth pixel PXL4, the fifth pixel PXL5, and the sixth pixel PXL6 may be positioned parallel to each other in the first direction DR1 in a second pixel row PXR2. The first pixel PXL1, the second pixel PXL2, and the third pixel PXL3 may be positioned parallel to the fourth pixel PXL4, the fifth pixel PXL5, and the sixth pixel PXL6 in the second direction DR2.

In one or more embodiments, the first pixel PXL1 and the fourth pixel PXL4 may be pixels for emitting red light, the second pixel PXL2 and the fifth pixel PXL5 may be pixels for emitting green light, and the third pixel PXL3 and the sixth pixel PXL6 may be pixels for emitting blue light. The disclosure is not limited thereto, and a color emitted by each pixel may be variously changed.

The first power line PL1 may extend in the first direction DR1 and may be positioned between the first pixel row PXR1 and the second pixel row PXR2. That is, one first power line PL1 may be located between two pixels adjacent to each other with respect to the second direction DR2.

The second opening OPN2 and the third opening OPN3 may be positioned along the second direction DR2 based on the first power line PL1. In addition, the first opening OPN1 may be positioned above (in a plan view) the second opening OPN2 with respect to the second direction DR2. The first, second, and third openings OPN1, OPN2, and OPN3 may be positioned in the first pixel row PXR1 and the second pixel row PXR2. That is, the display device according to some embodiments may include three openings for every two pixel rows.

The first power line PL1 may be electrically connected to the first electrode EL1 through the eleventh contact hole CH11 positioned between the first pixel PXL1 and the third pixel PXL3, may be electrically connected to the first electrode EL1 through the twelfth contact hole CH12 positioned between the second pixel PXL2 and the fifth pixel PXL5, and may be electrically connected to the first electrode EL1 through the thirteenth contact hole CH13 positioned between the third pixel PXL3 and the sixth pixel PXL6.

The second power line PL2 may be positioned on the first pixel row PXR1 and may extend in the first direction DR1. In addition, the second power line PL2 may be positioned under the second pixel row PXR2 and may be positioned in the first direction DR1.

The second power line PL2 may be electrically connected to the second electrode EL2 through the twenty-first contact hole CH21 positioned between the first pixel PXL1 and the second pixel PXL2. In addition, the second power line PL2 may be electrically connected to the second electrode EL2 through the twenty-second contact hole CH22 positioned between the second pixel PXL2 and the third pixel PXL3.

In one or more embodiments, the pixels positioned in the first pixel row PXR1 and the second pixel row PXR2 may receive the second driving voltage VSS (refer to FIG. 4) transmitted to the second electrode EL2 through the second power line PL2.

As described above with reference to FIG. 11, the first data conductor SD1, the second data conductor SD2, and the third data conductor SD3 may be positioned on the same layer as the first power line PL1 and/or the second power line PL2.

The first data conductor SD1 may be electrically connected to the first electrode EL1 through the thirteenth contact hole CH13 included in the first pixel PXL1 and the fourth pixel PXL4.

The second data conductor SD2 may be electrically connected to the first electrode EL1 through the fourteenth contact hole CH14 included in the second pixel PXL2 and the fifth pixel PXL5.

The third data conductor SD3 may be electrically connected to the first electrode EU through the sixteenth contact hole CH16 included in the third pixel PXL3 and the sixth pixel PXL6.

In one or more embodiments, after aligning the light emitting elements, a part of the first electrode EL1 and/or the second electrode EL2 may be removed to drive each pixel independently.

For example, the first opening OPN1, the second opening OPN2, and the third opening OPN3 may be removed on the first electrode EU positioned in the first pixel row PXR1 and the second pixel row PXR2.

Accordingly, each of the first pixel PXL1 and the fourth pixel PXL4 may receive the first driving voltage VDD (refer to FIG. 4) supplied through the thirteenth contact hole CH13 to drive the first pixel PXL1 and the fourth pixel PXL4, and a short defect that may occur as the first electrode EL1 and the second electrode EL2 are adjacent to each other may be reduced.

In addition, each of the second pixel PXL2 and the fifth pixel PXL5 may receive the first driving voltage VDD (refer to FIG. 4) through the fourteenth contact hole CH14 to drive the second pixel PXL2 and the fifth pixel PXL5, and each of the third pixel PXL3 and the sixth pixel PXL6 may receive the first driving voltage VDD (refer to FIG. 4) through the fifteenth contact hole CH15 to drive the third pixel PXL3 and the sixth pixel PXL6.

In addition, in one or more embodiments, as the first power line PL1 and the second power line PL2 are located one by one for every two pixel rows along the first direction DR1, and the first electrode EL1 and the second electrode EL2 are located to be electrically connected to each pixel column along the second direction DR2. The first power line PL1, the second power line PL2, the first electrode EL1, and the second electrode EL2 may be located in a mesh shape.

Hereinafter, an aspect according to pixel disposition of a display device according to some embodiments is described with reference to FIG. 13.

Figure 13:
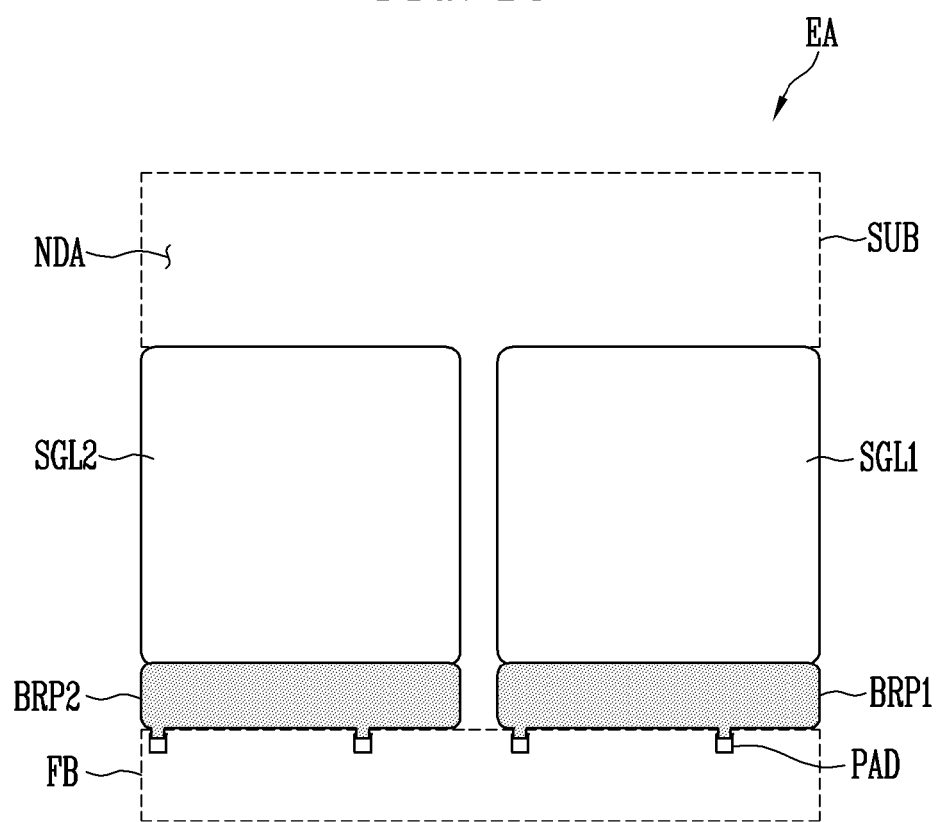
FIG. 13 is a plan view schematically illustrating EA of FIG. 1.

FIG. 13 is a plan view schematically illustrating EA of FIG. 1. Hereinafter, the disclosure is described with reference to FIGS. 1 to 3 together.

Referring to FIG. 13, in the non-display area NDA of the substrate SUB of the display device according to some embodiments, the first line SGL1, the second line SGL2, a first bridge electrode BRP1, and a second bridge electrode BRP2, and a plurality of pads PAD may be located. The plurality of pads PAD may be positioned to overlap the circuit board FB.

The first line SGL1 and the second line SGL2 may be located to be spaced apart from each other. The first bridge electrode BRP1 and the second bridge electrode BRP2 may be located to be spaced apart from each other.

The first line SGL1 may be electrically connected to the first bridge electrode BRP1, and the first bridge electrode BRP1 may be electrically connected to at least one pad PAD. Accordingly, the first alignment signal or the first driving voltage transmitted to the at least one pad PAD may be applied to the first line SGL1.

The second line SGL2 may be electrically connected to the second bridge electrode BRP2, and the second bridge electrode BRP2 may be electrically connected to at least one pad PAD. Accordingly, the second alignment signal or the second driving voltage transmitted to the at least one pad PAD may be applied to the second line SGL2.

Because the display device according to some embodiments may apply the alignment signal or the driving voltage to the pixels through the first line SGL1 and the second line SGL2, the first line SGL1 and the second line SGL2 may be widely located in the non-display area NDA. In addition, the display device according to some embodiments may a reduce load of a line, by locating lines necessary for driving the pixel in the non-display area NDA to a minimum.

Although the disclosure has been described with reference to the embodiments disclosed above, those skilled in the art or those having a common knowledge in the art will understand that the disclosure may be various modified and changed without departing from the spirit and technical area of the disclosure described in the claims which will be described later. Therefore, the technical scope of the disclosure should not be limited to the contents described in the detailed description of the specification, but should be defined by the claims, with functional equivalents thereof to be included therein.

What is claimed is:

1. A display device comprising:
a substrate;
a first power line extending in a first direction on the substrate, and configured to transmit a first driving voltage;
a second power line extending in the first direction on the substrate, and configured to transmit a second driving voltage;
a first electrode extending in a second direction perpendicular to the first direction, to which the first driving voltage is applied;
a second electrode spaced apart from the first electrode and, extending in the second direction, to which the second driving voltage is applied; and
a light-emitting element between the first electrode and the second electrode, connected to a first contact electrode and to a second contact electrode, and having been aligned by a first alignment signal supplied to the first electrode via the first power line and a second alignment signal supplied to the second electrode via the second power line;
wherein the first electrode is electrically connected to the first power line and to the first contact electrode, and
wherein the second electrode is electrically connected to the second power line and to the second contact electrode.

2. The display device according to claim 1, further comprising a protective layer between the first power line and the first electrode, which are on different layers,
wherein the first power line and the second power line are on a same layer, and
wherein the first electrode and the second electrode are on a same layer.

3. The display device according to claim 2, wherein the first electrode is electrically connected to the first power line through a first contact hole of the protective layer.

4. The display device according to claim 2, wherein the second electrode is electrically connected to the second power line through a second contact hole of the protective layer.

5. The display device according to claim 2, further comprising a data conductive layer on a same layer as the first power line,
wherein the data conductive layer comprises a first data conductor and a second data conductor configured to transmit the first driving voltage.

6. The display device according to claim 5, wherein the first data conductor and the second data conductor are electrically connected to the first electrode respectively through contact holes of the protective layer.

7. The display device according to claim 6, wherein a part of the first electrode is discontinuous at a first opening, a second opening, and a third opening.

8. The display device according to claim 7, wherein a remaining part of the first electrode is between the first opening and the second opening, and is electrically connected to the data conductive layer.

9. The display device according to claim 1, wherein a first end part of the light-emitting element is electrically connected to the first electrode, and
wherein a second end part of the light-emitting element is electrically connected to the second electrode.

10. A display device comprising:
a substrate on which a first pixel row of pixels and a second pixel row of pixels are located;
a first power line extending in a first direction between the first pixel row and the second pixel row, and configured to supply a first driving voltage;
a second power line extending from one side of the first pixel row in the first direction, and configured to supply a second driving voltage;
a first electrode extending in a second direction perpendicular to the first direction, to which the first driving voltage is applied;
a second electrode spaced apart from the first electrode and, extending in the second direction, to which the second driving voltage is applied; and
a light-emitting element between the first electrode and the second electrode, connected to a first contact electrode and to a second contact electrode, and having been aligned by a first alignment signal supplied to the first electrode via the first power line and a second alignment signal supplied to the second electrode via the second power line,
wherein the first electrode is electrically connected to the first power line and to the first contact electrode, and
wherein the second electrode is electrically connected to the second power line and to the second contact electrode.

11. The display device according to claim 10, further comprising:
a protective layer between the first power line and the first electrode, which are on different layers,
wherein the first power line and the second power line are on a same layer, and
wherein the first electrode and the second electrode are on a same layer.

12. The display device according to claim 11, wherein the first electrode is electrically connected to the first power line through a first contact hole of the protective layer, and
wherein the second electrode is electrically connected to the second power line through a second contact hole of the protective layer.

13. The display device according to claim 12, further comprising a first data conductor, a second data conductor, and a third data conductor on a same layer as the first power line, and each configured to transmit the first driving voltage,
- wherein the first pixel row comprises a first pixel, a second pixel, and a third pixel extending in the first direction.

14. The display device according to claim 13, wherein the first data conductor is electrically connected to the first electrode through a first contact hole of the first pixel,
- wherein the second data conductor is electrically connected to the first electrode through a first contact hole of the second pixel, and
- wherein the third data conductor is electrically connected to the first electrode through a first contact hole of the third pixel.

15. A display device comprising:
- a substrate comprising a display area for displaying an image, and a non-display area on at least one side of the display area;
- a first line in the non-display area, and configured to supply a first driving voltage;
- a second line in the non-display area, and configured to supply a second driving voltage;
- a first electrode in the display area, and electrically connected to the first line and to a first contact electrode;
- a second electrode in the display area, and electrically connected to the second line and to a second contact electrode; and
- a light-emitting element between the first electrode and the second electrode, connected to the first contact electrode and to the second contact electrode, and having been aligned by a first alignment signal supplied to the first electrode via the first line and a second alignment signal supplied to the second electrode via the second line.

16. The display device according to claim 15, further comprising a first power line extending in a first direction on the substrate, and configured to transmit the first driving voltage,
- wherein the first electrode is electrically connected to the first line through the first power line.

17. The display device according to claim 16, further comprising a second power line extending in the first direction on the substrate, and configured to transmit the second driving voltage,
- wherein the second electrode is electrically connected to the second line through the second power line.

* * * * *